United States Patent
Gonzalez et al.

(10) Patent No.: US 6,489,219 B1
(45) Date of Patent: Dec. 3, 2002

(54) METHOD OF ALLOYING A SEMICONDUCTOR DEVICE

(75) Inventors: Fernando Gonzalez, Boise, ID (US); Thomas A. Figura, Boise, ID (US); J. Brett Rolfson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 08/555,801

(22) Filed: Nov. 9, 1995

(51) Int. Cl.[7] .............................................. H01L 21/324
(52) U.S. Cl. ........................................ 438/475; 438/795
(58) Field of Search .................................. 438/798, 475, 438/537, 586, 622, 143, 477, 953

(56) References Cited

U.S. PATENT DOCUMENTS

| | | | |
|---|---|---|---|
| 3,849,204 A | * 11/1974 | Fowler | 438/475 |
| 4,364,779 A | * 12/1982 | Kamgar et al. | 427/82 |
| 5,248,348 A | * 9/1993 | Miyachi et al. | 437/108 |
| 5,250,444 A | * 10/1993 | Khan et al. | 438/798 |
| 5,273,920 A | * 12/1993 | Kwasnick et al. | 438/798 |
| 5,304,509 A | * 4/1994 | Sopori | 438/78 |
| 5,336,533 A | * 8/1994 | Balmashnov et al. | 427/562 |
| 5,336,623 A | * 8/1994 | Sichanugrist et al. | 437/4 |
| 5,403,756 A | * 4/1995 | Yoshinouchi et al. | 437/528 |
| 5,425,843 A | 6/1995 | Saul et al. | 156/643.1 |
| 5,516,731 A | * 5/1996 | Toutounchi et al. | 438/148 |
| 5,543,336 A | * 8/1996 | Enami et al. | 437/24 |

* cited by examiner

*Primary Examiner*—Savitri Mulpuri
(74) *Attorney, Agent, or Firm*—Workman, Nydegger & Seeley

(57) ABSTRACT

An improved method for alloying a semiconductor substrate upon which wordlines enclosed in spacers have been formed, with the substrate exposed between the wordlines. A thin sealing layer is then deposited over the substrate and the wordlines, the sealing layer helping to maintain the alloy in said substrate. The alloying material employed of the substrate is optionally monatomic hydrogen. Alloying the substrate with monatomic hydrogen may also be used after deposition of a metal layer, or at other process steps as desired.

30 Claims, 2 Drawing Sheets

METHOD OF ALLOYING A SEMICONDUCTOR DEVICE

BACKGROUND OF THE INVENTION

1. The Field of the Invention

The present invention relates to the manufacture of semiconductor devices. More particularly, the present invention is directed to an improved method of alloying a semiconductor device during the manufacture thereof.

2. The Relevant Technology

Hydrogen alloying, or annealing in a hydrogen atmosphere, is used to heal damage caused to the lattice structure of the crystalline semiconductor substrate by the various processes used to form circuit structures. Hydrogen, in the alloying process, forms bonds with damaged areas of the substrate, tying up dangling bonds of substrate atoms and improving the electrical properties of the substrate.

Hydrogen alloying is typically employed near the end of an integrated circuit fabrication procedure, after all circuit devices have been formed. Some typical structures present on a semiconductor substrate during such post-metal alloying are shown in cross section in FIG. 1.

FIG. 1 shows a partial cross section of a semiconductor device. Semiconductor substrate 12, typically a silicon substrate, has an isolation region 14, typically field oxide, which has been grown thereon. Wordlines 16 each enclosed in spacers 18 are formed over substrate 12 and isolation region 14. A thin etch-stop and sealing layer 20, typically silicon nitride, is present on substrate 12 and isolation region 14 except where plugs 24 contact substrate 12. Plugs 24 are formed of an electrically conductive material and extend from substrate 12 up through a first dielectric planarization layer 22. A capacitor structure including capacitor plate 26, thin dielectric layer 28, and capacitor plate/ground line 30 is formed in contact with one plug 24. In contact with the other plug 24 is a conductive-material via 34, typically formed of metal, which extends upward from the other plug 24 through a second dielectric planarization layer 32 to a conductive-material bitline 36, also typically formed of metal.

The typical hydrogen alloying step is performed upon structures identical to or similar to those shown in FIG. 1. Sealing layer 20 is relatively impervious to diffusion of various dopants, including hydrogen. Other structures formed on substrate 12 can also impede the diffusion of hydrogen somewhat. Thus the path hydrogen must take to diffuse into substrate 12 typically takes the form of path P shown in FIG. 1. The hydrogen must typically pass through or around bitline 36, along via 34 and plug 24 and down into substrate 12 to alloy substrate 12 in region R. As circuit density in semiconductor devices increases, diffusion of hydrogen along path P of FIG. 1 becomes lengthy and more difficult, such that adequate hydrogen alloying of substrate 12 cannot be achieved. Thus an improved hydrogen alloying method is needed.

SUMMARY AND OBJECTS OF THE INVENTION

An object of the present invention is to provide a method of alloying a semiconductor device, said method providing adequate alloying even in highly dense devices. Still another object of the present invention is to provide a rapid method of alloying a semiconductor device.

Still another object of the present invention is to provide a method of alloying a semiconductor device in situ with existing process steps.

In accordance with one preferred method of the present invention, alloying is performed upon a substrate on which wordlines enclosed in spacers have been formed, with the substrate exposed between the wordlines. A thin sealing layer is then deposited over the substrate and the wordlines, the sealing layer helping to maintain the hydrogen in the substrate. The hydrogen employed in alloying the substrate is optionally monatomic hydrogen.

According to another preferred method of the present invention, alloying is performed with monatomic hydrogen at a post-metal alloying step. Alloying with monatomic hydrogen may also be used at other process steps as desired.

Alloying while the substrate is still directly exposed can allow for a greater alloy concentration. The thin sealing layer deposited thereafter helps maintain the alloy concentration, such that subsequent damage to the substrate may be repaired in situ.

Alloying with monatomic hydrogen increases the diffusivity and reactivity of the hydrogen, allowing shorter process times and lower temperatures to achieve the same alloying effect.

These and other objects and features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and objects of the invention are obtained may be more fully explained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The present invention provides improved methods for alloying a semiconductor device, particularly the substrate thereof.

Figure 1:
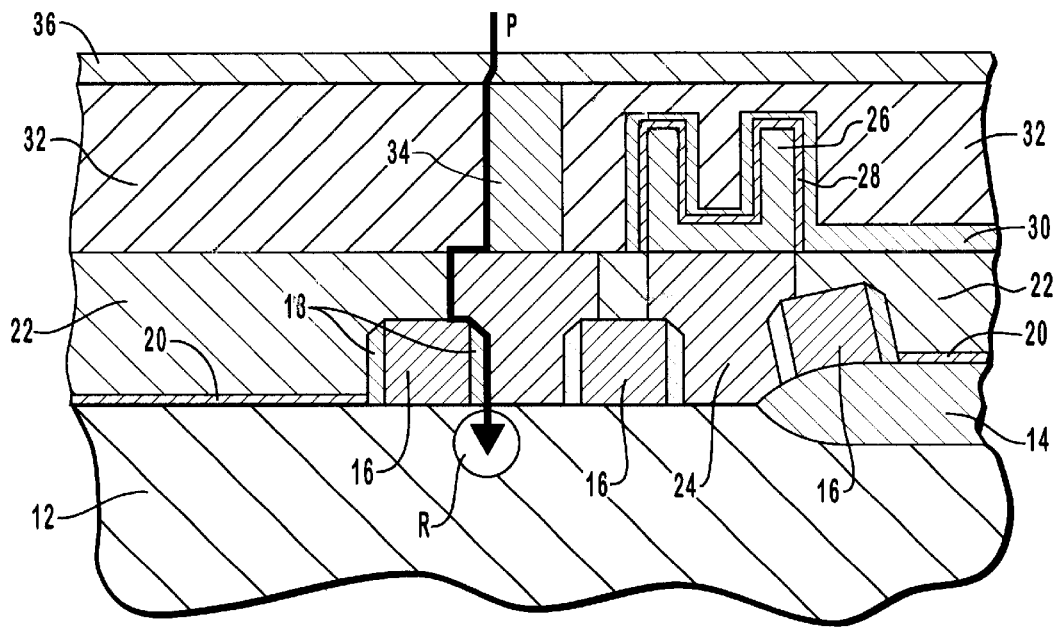
FIG. 1 is a partial cross section of a semiconductor device, showing the path P of hydrogen diffusion during post-metal alloying.

According to a one preferred method of the present invention, the alloying is performed at an early step of the fabrication process, rather than post-metal as illustrated in FIG. 1. A post-metal alloying step may optionally be employed in addition to the earlier alloying step.

Figure 2:
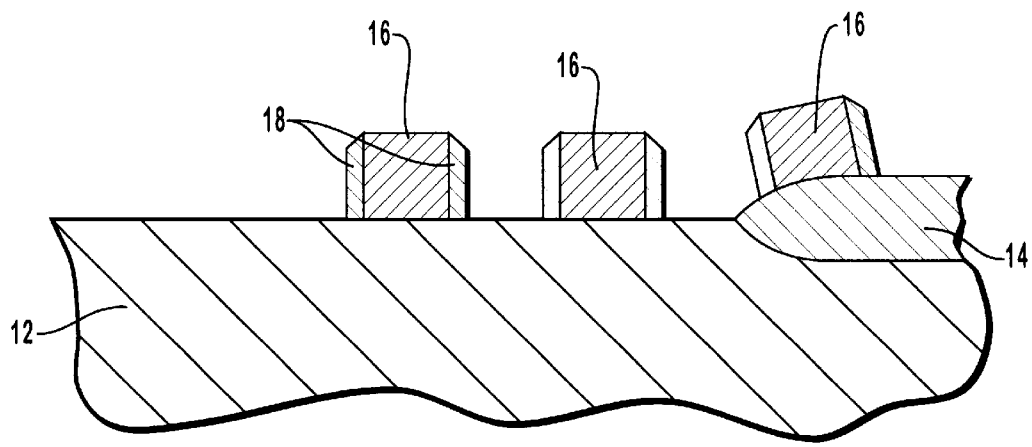
FIG. 2 is a partial cross section of a partially formed semiconductor device after formation of wordlines enclosed in spacers, showing the path P of hydrogen to a substrate according to one method of the present invention.

As shown in FIG. 2, at an earlier typical processing step, wordlines 16 enclosed in spacers 18 have been formed over substrate 12 and isolation region 14. Substrate 12 or isolation region 14 is exposed directly except at the locations of wordlines 16. According to a preferred method of the present invention, the semiconductor device is alloyed at the processing step represented in FIG. 2. The alloying material will preferably be hydrogen. The alloying material may also include, in addition to hydrogen, an inert gas and/or nitrogen. By way of example, the inert gas can be argon, helium, or a mixture of both. The alloying is material, which has direct access to substrate 12, then travels path P of FIG. 2 to reach substrate 12.

Figure 3:
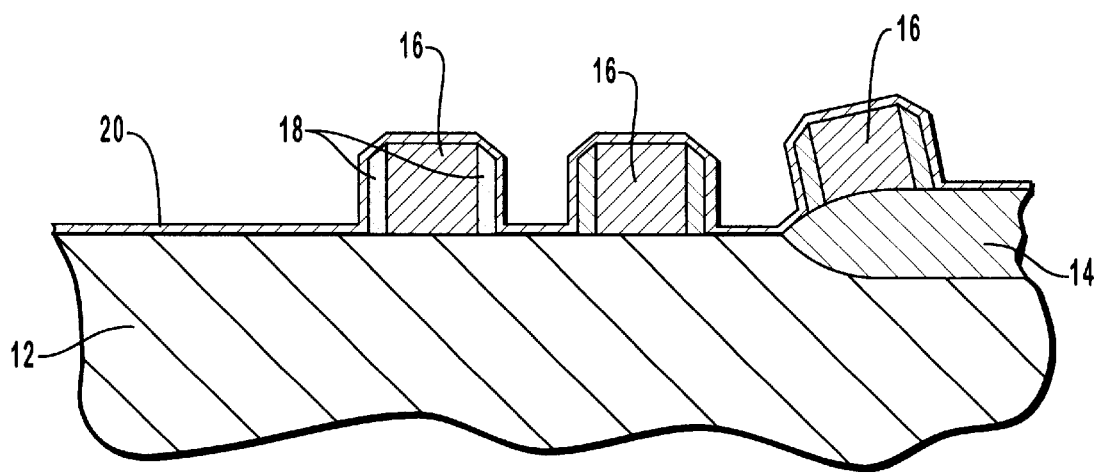
FIG. 3 is the cross section of FIG. 2 after deposition of a thin sealing layer.

Immediately after alloying, a thin sealing layer 20, preferably silicon nitride but possibly alumina or layered nitride and oxide, is deposited over substrate 12 and all structures thereon, as shown in FIG. 3. Thin sealing layer 20 remains through subsequent processing in the semiconductor device over substantial areas of the substrate. This is seen in FIG. 1, where portions of thin sealing layer 20 remain. Thin sealing layer 20 is more impervious to the alloying material, helping to retain the alloying material in substrate 12. This allows the alloying material to remain in the substrate and repair substrate damage at later fabrication steps. The earlier alloying also assists in assuring sufficient total alloying after an optional post-metal alloying step.

Thin sealing layer 20 is already present in typical processing in the form of a thin nitride layer which serves as a diffusion barrier and an etch stop. Thus the above preferred method of the present invention may be beneficially incorporated into the nitride deposition process. A standard nitride deposition chamber such as an LPCVD reactor or furnace may be used first to alloy the substrate in a hydrogen atmosphere at temperatures of preferably 400° C., or greater. The hydrogen is then evacuated, a vacuum drawn, and the typical LPCVD nitride deposition carried out. The preferred method is a plasma enhanced LPCVD. This in situ hydrogen alloying avoids adding process steps and provides maximum hydrogen content at the time the thin sealing layer of nitride is deposited.

Figure 4:
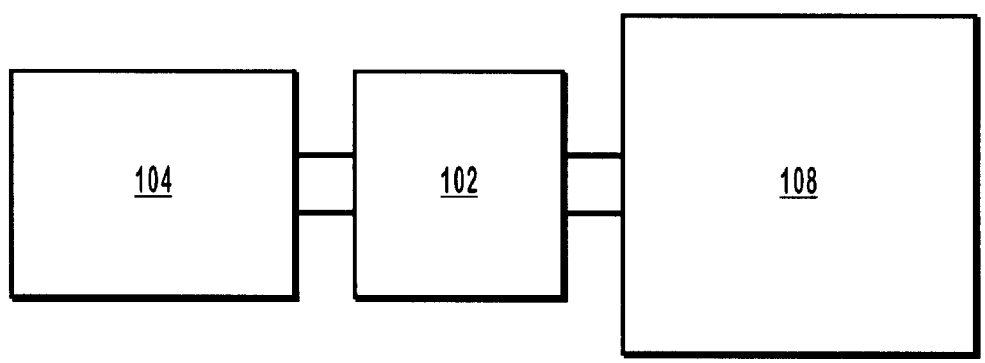
FIG. 4 is a schematic representation of some equipment useful in one method of the present invention.

According to another preferred method of the present invention, the semiconductor device is alloyed in an atmosphere substantially comprised of monatomic hydrogen instead of the typical diatomic hydrogen. Monatomic hydrogen may be provided as illustrated in FIG. 4 by passing hydrogen from a hydrogen source 104 through an energy source such as ionizer 102 and thence to a process chamber 108. Ionizer 102 may take many forms, including an ultraviolet light source, an RF generator, an electron beam ionizer, an ECR plasma generator, and the like. Alternatively, monatomic and ionized hydrogen may be created from diatomic hydrogen in the process chamber itself by an RF plasma or other typical means. Hydrogen ions may optionally be accelerated by a potential difference such as a biased substrate or substrate holder. Hydrogen ions may optionally also be guided, focussed, or filtered through the use of magnetic fields.

The use of monatomic hydrogen in this preferred method of the present invention has several benefits. Monatomic hydrogen presents a smaller cross section, diffusing more rapidly through the relatively long path P for post-metal anneal as shown in FIG. 1. Monatomic hydrogen is also more reactive than diatomic hydrogen, allowing the diffused hydrogen to more rapidly tie up dangling bonds in the substrate. This greater diffusivity and greater reactivity allow shorter processing times in furnace applications.

Monatomic hydrogen alloying may be used at post-metal alloying. Monatomic hydrogen alloying may also be in conjunction with the first preferred method discussed above, early in the fabrication process just before depositing a thin layer of nitride. Monatomic hydrogen alloying may also be performed in situ before or after existing process steps, such as before the thin nitride deposition as discussed above, or after a dry etch in the same process chamber, or at any other process point at which substrate repair is needed.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method for improved alloying of a semiconductor substrate of an integrated circuit device, said method comprising:

providing the semiconductor substrate with an electrical device formed thereon, a surface on said semiconductor substrate being exposed to the ambient;

alloying said semiconductor substrate through the exposed surface on the semiconductor substrate in an atmosphere containing hydrogen; and forming, after said alloying and with no intervening fabrication step, a sealing layer over said semiconductor substrate and all structures thereon, whereby said sealing layer assists in retaining in said semiconductor substrate said hydrogen introduced through the exposed surface on the semiconductor substrate into said semiconductor substrate during said alloying.

2. The method as defined in claim 1, wherein forming a sealing layer is performed in situ after alloying said semiconductor substrate.

3. The method as defined in claim 1, wherein said semiconductor substrate comprises a silicon substrate and said sealing layer comprises silicon nitride.

4. The method as defined in claim 1, wherein alloying said semiconductor substrate comprises alloying said semiconductor substrate in an atmosphere containing monatomic hydrogen.

5. The method as defined in claim 4, wherein alloying said semiconductor substrate further comprises passing diatomic hydrogen through an ionizer to produce monatomic and ionized hydrogen.

6. The method as defined in claim 5, wherein said ionizer comprises an ultraviolet light source.

7. The method as defined in claim 5, wherein said ionizer comprises an RF source.

8. The method as defined in claim 5, wherein said ionizer comprises an E-beam source.

9. The method as defined in claim 5. wherein alloying said semiconductor substrate further comprises accelerating said ionized hydrogen across a potential difference.

10. The method as defined in claim 5, wherein alloying said semiconductor substrate further comprises guiding said ionized hydrogen in a magnetic field.

11. The method of claim 1, further including forming a passivation layer over said semiconductor substrate and all structures thereon, and wherein alloying said semiconductor substrate is performed prior to forming the passivation layer.

12. An improved method for alloying a semiconductor substrate in an integrated circuit device, said method comprising:

emplacing the semiconductor substrate in a chamber having an ambient atmosphere substantially comprised of monatomic hydrogen, said semiconductor substrate having a surface thereon exposed to the ambient; and alloying the semiconductor substrate through the exposed surface on the semiconductor substrate in the ambient atmosphere substantially comprised of monatomic hydrogen, wherein said alloying immediately precedes the formation on said exposed surface of a sealing layer to retain in said semiconductor substrate said alloying hydrogen.

13. The method as defined in claim 12, further including forming a passivation layer over said semiconductor substrate and all structures thereon, and wherein alloying the semiconductor substrate is performed prior to forming the passivation layer.

14. The method as defined in claim 12, wherein the semiconductor substrate has at least two wordlines enclosed in spacers formed thereon, said exposed surface that is exposed to the ambient being situated between said at least two wordlines, and wherein alloying the semiconductor substrate comprises:

alloying said substrate in an atmosphere substantially comprised of monatomic hydrogen; and forming a silicon nitride over said substrate and all structures thereon, whereby said silicon nitride assists in retaining in said substrate said monatomic hydrogen introduced into said semiconductor substrate through the exposed surface on the semiconductor substrate during said alloying of the semiconductor substrate.

15. The method as defined in claim 14, further comprising forming a passivation layer over said semiconductor substrate and all structures thereon subsequent to forming said silicon nitride over said semiconductor substrate.

16. The method as defined in claim 15, wherein alloying the semiconductor substrate further comprises accelerating said ionized hydrogen across a potential difference.

17. The method as defined in claim 12, wherein alloying the semiconductor substrate further comprises alloying said substrate in ionized hydrogen.

18. The method as defined in claim 17, wherein alloying the semiconductor substrate further comprises guiding said ionized hydrogen with a magnetic field.

19. The method as defined in claim 12, wherein alloying the semiconductor substrate comprises alloying said substrate in an atmosphere including monatomic hydrogen in situ within said chamber after a dry etch.

20. The method as defined in claim 12, wherein the ambient atmosphere substantially comprised of monatomic hydrogen is also comprised of an inert gas.

21. A method of alloying a silicon substrate comprising:

providing a silicon substrate having at least two wordlines enclosed in spacers formed thereon, a surface of said silicon substrate between said at least two wordlines being exposed to the ambient;

alloying said silicon substrate through said exposed surface of said silicon substrate in an atmosphere containing monatomic hydrogen; and depositing, after said alloying and with no intervening fabrication step, a layer of silicon nitride over said silicon substrate and all structures thereon, whereby said layer of silicon nitride assists in retaining in said silicon substrate said monatomic hydrogen introduced into said silicon substrate through said exposed surface of said silicon substrate.

22. The method as defined in claim 21, wherein depositing a thin layer of silicon nitride is performed in situ after alloying said silicon substrate.

23. The method as defined in claim 22, further including depositing a passivation layer over said silicon substrate and all structures thereon after depositing said layer of silicon nitride, and wherein alloying said silicon substrate is performed prior to depositing the passivation layer.

24. The method as defined in claim 21, further comprising enclosing said at least two wordlines on said silicon substrate in spacers.

25. A method for alloying a semiconductor material comprising:

providing a semiconductor material having:
an electrical device formed thereon; and
an exposed surface on said semiconductor material;

alloying the semiconductor material by introducing hydrogen therein through the exposed surface; and forming a sealing material over the semiconductor material to retain therein the hydrogen introduced through the exposed surface.

26. A method for alloying a semiconductor material comprising:

providing a semiconductor material having:
an electrical device formed thereon; and
an exposed surface on said semiconductor material;

alloying the semiconductor material by introducing hydrogen therein through the exposed surface in an ambient atmosphere of hydrogen and at least one of an inert gas and nitrogen; and forming a sealing material over the semiconductor material to retain therein the hydrogen introduced through the exposed surface.

27. The method as defined in claim 26, further comprising forming a passivation material over said sealing material and said electrical device.

28. A method for alloying a semiconductor material comprising:

providing a semiconductor material having:
an electrical device formed thereon; and
an exposed surface on said semiconductor material;

alloying the semiconductor material by introducing hydrogen therein through the exposed surface in an ambient atmosphere substantially comprised of monatomic hydrogen; and forming a sealing material over the semiconductor material to retain therein the hydrogen introduced through the exposed surface.

29. A method for alloying a semiconductor material comprising:

providing a semiconductor material having:
an electrical device formed thereon; and
an exposed surface on said semiconductor material;

alloying the semiconductor material by introducing hydrogen therein through the exposed surface in an ambient atmosphere comprising of ionized hydrogen; and forming a sealing material over the semiconductor material to retain therein the hydrogen introduced through the exposed surface.

30. The method as defined in claim 29, wherein the ambient atmosphere further comprises monatomic hydrogen.

* * * * *

UNITED STATES PATENT AND TRADEMARK OFFICE
CERTIFICATE OF CORRECTION

PATENT NO. : 6,489,219 B1 Page 1 of 1
DATED : December 3, 2002
INVENTOR(S) : Fernando Gonzalez, Thomas A. Figura and J. Brett Rolfson It is certified that error appears in the above-identified patent and that said Letters Patent is hereby corrected as shown below:

Column 3,
Line 7, delete "is"

Column 6,
Line 16, after "forming" insert -- , after said alloying and before any substantial amount of said alloying hydrogen escapes from said semiconductor material, --
Lines 30, 47 and 60, after "forming" insert -- , after said alloying and with no intervening fabrication step, --
Line 58, delete "of"

Signed and Sealed this

Third Day of June, 2003

JAMES E. ROGAN
*Director of the United States Patent and Trademark Office*